(12) United States Patent
Reynolds

(10) Patent No.: US 6,380,775 B1
(45) Date of Patent: *Apr. 30, 2002

(54) MULTIPLEXED DISTRIBUTION SYSTEM FOR CMOS SIGNALS

(75) Inventor: David C. Reynolds, Georgetown, MA (US)

(73) Assignee: Analog Devices, Inc., Norwood, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/464,298

(22) Filed: Jun. 5, 1995

Related U.S. Application Data

(63) Continuation of application No. 08/159,812, filed on Nov. 30, 1993, now abandoned.

(51) Int. Cl.$^7$ .................................................. H03L 7/00
(52) U.S. Cl. .......................... 327/153; 327/99; 327/212
(58) Field of Search ................................. 327/261, 263, 327/99, 198, 202, 203, 211, 212, 153, 161

(56) References Cited

U.S. PATENT DOCUMENTS

| | | | |
|---|---|---|---|
| 3,947,697 A | | 3/1976 | Archer et al. |
| 4,929,850 A | * | 5/1990 | Breuninger |
| 5,138,189 A | * | 8/1992 | Leung et al. |

* cited by examiner

Primary Examiner—Toan Tran
Assistant Examiner—Long Nguyen
(74) Attorney, Agent, or Firm—Samuels, Gauthier & Stevens, LLP

(57) ABSTRACT

First and second clocked digital sources are provided in each of two data paths, and are clocked by respective direct and complementary clock pulses. The clocked outputs of these devices are directed to a multiplexer where the inter-leaved data path signals are recombined into a single output line. This multiplexer includes clocked transmission gates, the clock signals for which are shifted in time by 90° from the clock signals applied to the originating signal sources. The result is that additional time is made available for sampling the digital signals applied to the multiplexer.

2 Claims, 3 Drawing Sheets

MULTIPLEXED DISTRIBUTION SYSTEM FOR CMOS SIGNALS

This application is a continuation application of Ser. No. 08/159,812 as originally filed on Nov. 30, 1993 abandoned.

BACKGROUND OF THE INVENTION

1. Field of the Invention

This invention relates to clock-controlled digital signal devices arranged in a multiplexed CMOS system. More particularly, this invention relates to such a system where the outputs of clocked digital signal sources are supplied to a clocked multiplexer to produce a composite output merging the stream of both signal sources.

2. Description of the Prior Art

It is known in digital integrated circuit chips to split a data handling system into two data paths (odd and even) each running at one-half the basic data rate, and thereafter to merge the odd and even output signals to obtain the desired combined output signals. Such split data paths require more IC area, but since each data path runs at one-half the basic speed, the data handling elements are easier to design and to make than for devices running at full speed.

This split-path interleaved arrangement requires a multiplexer to combine the output signals from both data paths. Conventionally, the multiplexer is clocked by the same stream of clock pulses as are applied to the initiating data signal sources. This has turned out not to be an efficient arrangement, and further improvement is needed.

SUMMARY OF THE INVENTION

In a preferred embodiment of the invention, to be described hereinbelow in detail, first and second clocked digital sources are provided in each of two data paths respectively, and are clocked by respective direct and complementary clock pulses. The clocked outputs of these devices are directed to a multiplexer where the interleaved data path signals are recombined into a single output line. This multiplexer includes the usual clocked transmission gates, but in this invention the clock signals are shifted in time by 90° from the clock signals applied to the originating signal sources. The result is that additional time is made available for sampling the digital signals applied to the multiplexer. Other objects, aspects and advantages of the invention will in part be pointed out in, and in part apparent from, the following description of a preferred embodiment, considered together with the accompanying drawings.

DESCRIPTION OF A PREFERRED EMBODIMENT

Figure 1:
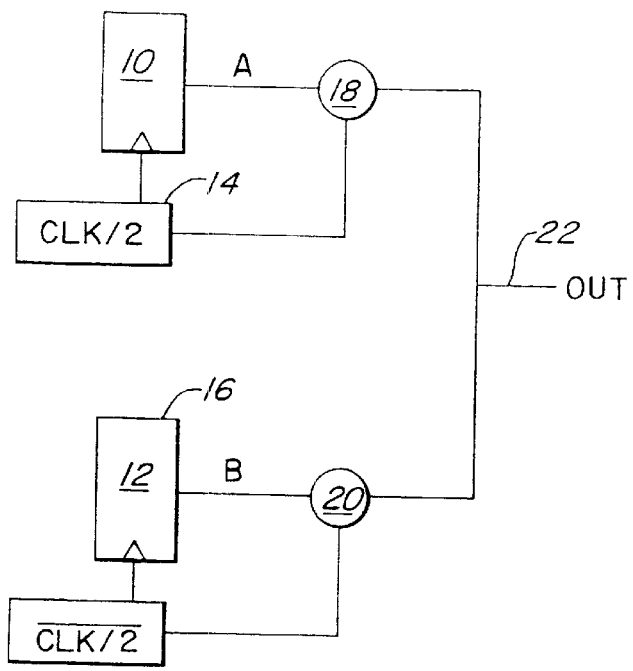
FIG. 1 is a block diagram illustration of a prior art arrangement.

Referring first to FIG. 1, a known prior art CMOS digital signal system includes two data paths A and B (odd and even) having respective clocked CMOS digital signal sources 10 and 12. These signal sources may be any device producing binary output signals (high or low). The clock signals are at one-half the system clock speed, as indicated by the legend CLK/2 shown in the upper clock source 14, and by the complement of $\overline{CLK/2}$, indicated in the lower clock source 16.

The clocked outputs of the signal sources 10, 12 are directed to respective CMOS transmission gates 18, 20 in the clock paths A, B. Those gates, which may for example comprise paralleled MOS switches (PMOS and NMOS) are clocked by the corresponding CMOS clock sources 14, 16. The outputs of these gates present interleaved data signals which are merged on the output line 22, which in effect carries the data at full speed.

Figure 2:
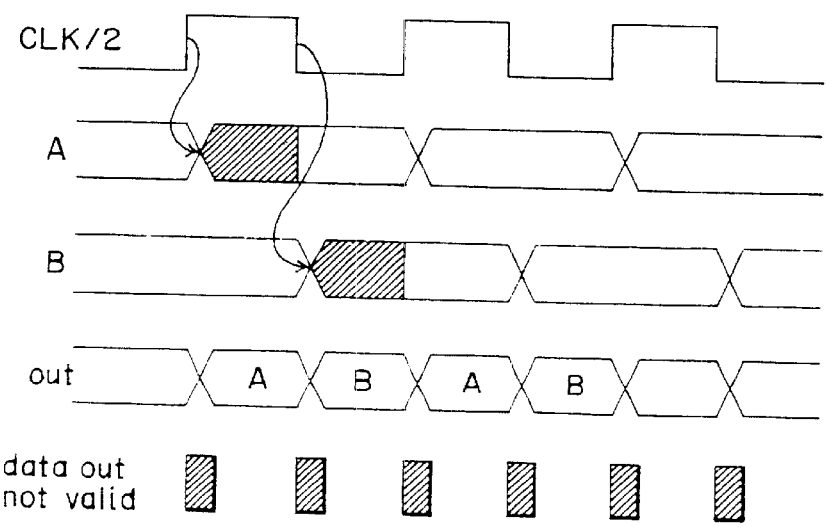
FIG. 2 is a timing diagram for the system of FIG. 1.

The timing diagram of FIG. 2 shows how the data signals from sources 10, 12 are sampled. The direct clock pulses are shown as rising edges in the top line, labelled CLK/2, with the complementary clock pulses being provided by the falling edges. The transmission gate sampling occurs at these clock pulse times. As shown in the lines labelled A and B, sampling occurs at time periods (dark hatching) delayed beyond the rising and falling edges of the clock signal, due to switching delays and to the fact that the data does not immediately become valid. In high speed designs, this delay becomes significant. The resulting output signals are shown in the "out" line. It will be seen that a substantial portion of the sample time is not usable, and this is indicated in the bottom line with lightly-hatched rectangles. It should be noted that although A and B are valid for much longer than needed, yet nevertheless sampling occurs while the signals are not yet valid. Thus the sampling operation is inherently inefficient.

Figure 3:
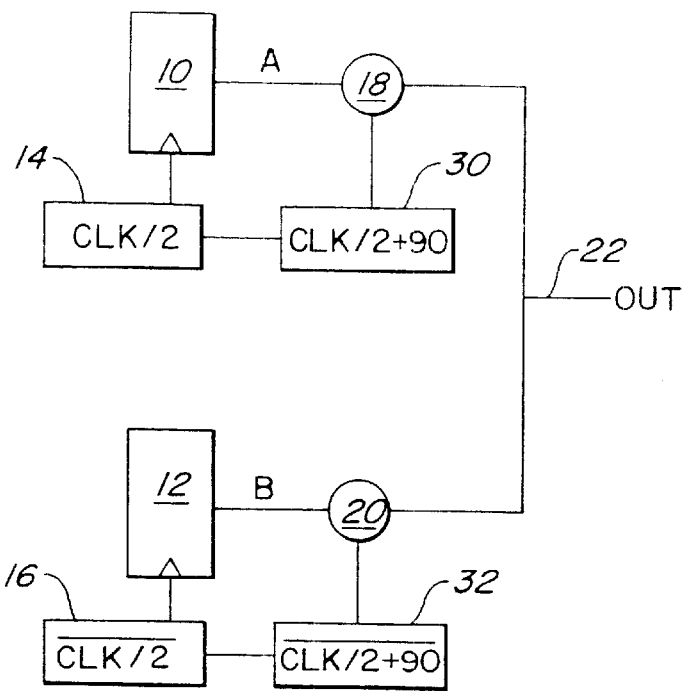
FIG. 3 is a block diagram like FIG. 1 but showing clock signal timing in accordance with the invention.

This problem is solved by the present invention. As shown in FIG. 3, the system is similar to that shown in FIG. 1, except that the clock pulses for the transmission gates 18, 20 are developed by phase-shifters 30, 32 driven by the original direct and complementary clocks CLK/2 and $\overline{CLK/2}$. The phase-shifted clock pulses occur at times intermediate the original direct and complementary clock pulses. More specifically, the phase shift is 90° (one quarter of a cycle), as indicated by legends CLK/2+90 and $\overline{CLK/2+90}$.

Figure 4:
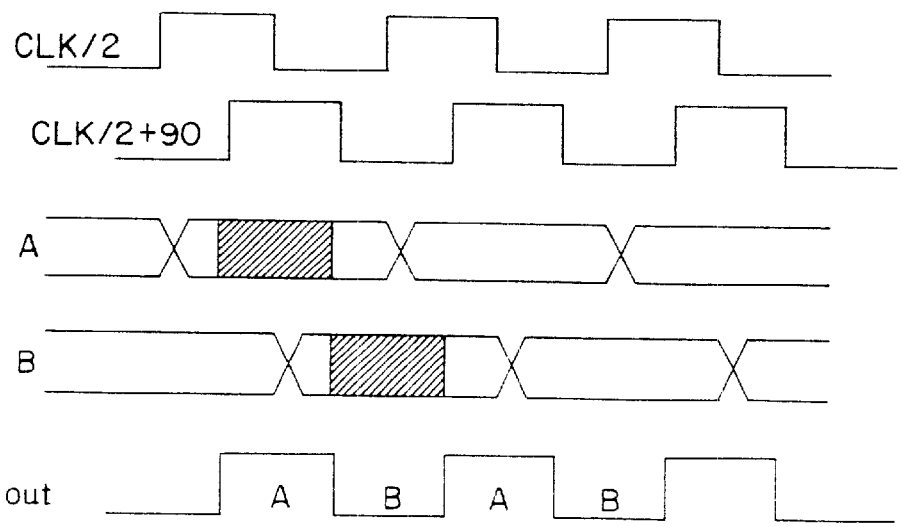
FIG. 4 is a timing diagram for the system of FIG. 3.

This arrangement is depicted in FIG. 4, where the top line is the original clock pulse stream CLK/2, and the second line is the 90° phase-shifted clock pulse stream CLK/2+90. This gives the outputs of the devices 10, 12 (e.g., flops) time to propagate and become valid before they are sampled. Lines 3 and 4 show that the sample times now are larger than before (dark hatching) and that there is no loss in availability due to switching delays or the like. That is, the hatched areas are now away from the changing edges of the data signals. This translates into much more data valid time at the multiplexer output.

Figure 5:
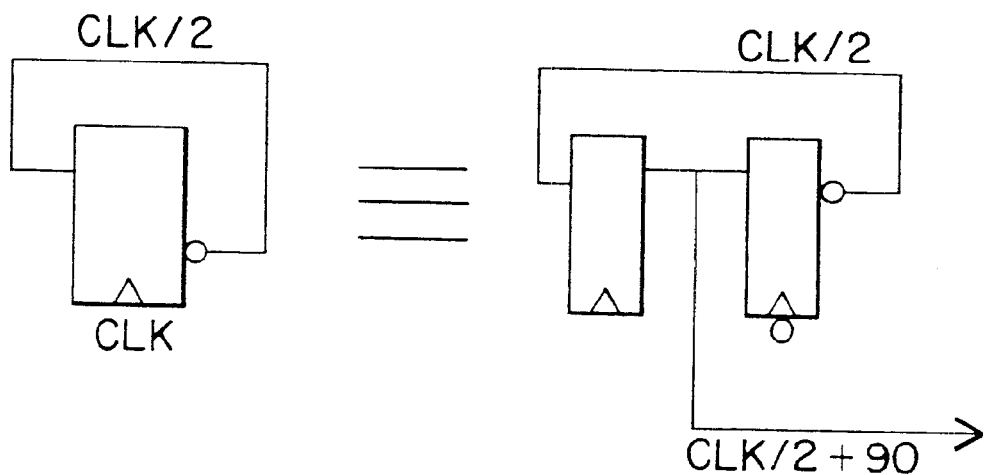
FIG. 5 shows one arrangement for developing the required clock signal timing.

The clock signals for the devices 10, 12 and the multiplexer gates 18, 20 may be derived from a CMOS clock divider circuit comprising a flip flop configured as a "t flop" or divider, as shown in FIG. 5. The 90 degree phase shifted signal is derived by tapping the intermediate node between the master and slave latches.

Although a preferred embodiment of the invention has been disclosed herein in detail, it is to be understood that this is for the purpose of illustrating the invention, and should not be construed as necessarily limiting the scope of the invention since it is apparent that many changes can be made by those skilled in the art while still practicing the invention claimed herein.

What is claimed is:

1. A CMOS distribution system with means for efficiently merging two synchronized data signals comprising:

a first clocked CMOS signal source having an output;

first clock means producing first clock pulses and coupled to said first signal source to activate said first signal source at the times of occurrence of said first clock pulses;

a second clocked CMOS signal source and having an output synchronized with the output of said first clocked CMOS signal source;

second clock means producing second clock pulses synchronized with and occurring at times complementary to said first clock pulses;

means coupling said second clock pulses to said second signal source to activate said second signal source at the times of occurrence of said second clock pulses;

first and second transmission gates having inputs and outputs with the inputs coupled to the outputs of said first and second signal sources respectively;

first phase-shifting means coupled to said first clock means to produce third clock pulses phase-shifted by at least approximately 90°;

means to couple said third clock pulses to said first transmission gate to activate said first gate at the times of occurrence of said third clock pulses;

second phase-shifting means coupled to said second clock means to produce fourth clock pulses phase-shifted by at least approximately 90°;

means to couple said fourth clock pulses to said second transmission gate to activate said second gate at the times of occurrence of said fourth clock pulses;

means to couple together the outputs of said first and second transmission gates to form a multiplexer for merging the signals produced at the outputs of said first and second transmission gates to develop a stream of signals corresponding to a composite of said synchronized output signals from said first and second clocked CMOS signal sources.

2. The method of distributing digital signals comprising the steps of:

producing first digital signals from a first clocked signal source;

activating said first signal source by a first stream of clock pulses;

producing second signals from a second clocked signal source;

activating said second signal source by a second stream of clock pulses complementary to said first stream of clock pulses;

directing said first digital signals to a first clocked transmission gate;

directing a third stream of clock pulses to said first transmission gate to activate said gate;

said third clock pulses being shifted in phase with respect to said first stream of clock pulses by at least approximately 90°;

directing said second digital signals to a second clocked transmission gate;

directing a fourth stream of clock pulses to said second transmission gate to activate said second gate;

said fourth clock pulses being shifted in phase with respect to said second stream of clock pulses by at least approximately 90°;

the phase-shifts of said third and fourth clock pulses being set to provide that said third and fourth clock pulses occur at times intermediate the times of said first and second clock pulses respectively; and alternatingly merging the signals produced by said first and second transmission gates.

* * * * *